United States Patent
Choi

(10) Patent No.: US 10,651,262 B2
(45) Date of Patent: May 12, 2020

(54) DISPLAY DEVICE

(71) Applicant: Samsung Display Co., Ltd., Yongin-si, Gyeonggi-do (KR)

(72) Inventor: Chulhyun Choi, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/263,715

(22) Filed: Jan. 31, 2019

(65) Prior Publication Data

US 2019/0252482 A1 Aug. 15, 2019

(30) Foreign Application Priority Data

Feb. 12, 2018 (KR) .................. 10-2018-0017151

(51) Int. Cl.
*H01L 27/32* (2006.01)
*H01L 51/52* (2006.01)

(52) U.S. Cl.
CPC ...... *H01L 27/3276* (2013.01); *H01L 27/3262* (2013.01); *H01L 51/5281* (2013.01)

(58) Field of Classification Search
CPC ............. H01L 27/3276; H01L 27/3262; H01L 27/124; H01L 51/5281
See application file for complete search history.

(56) References Cited

U.S. PATENT DOCUMENTS

| | | | |
|---|---|---|---|
| 7,791,266 B2 | 9/2010 | Kim | |
| 7,884,369 B2 | 2/2011 | Yamazaki et al. | |
| 9,134,583 B2 * | 9/2015 | Shim | G02F 1/1333 |
| 9,735,213 B2 | 8/2017 | Yang | |
| 9,865,667 B2 * | 1/2018 | Gil | H01L 27/3276 |
| 2018/0151662 A1 * | 5/2018 | Rhe | G06F 3/044 |
| 2018/0342564 A1 * | 11/2018 | Hanari | H01L 51/5228 |

FOREIGN PATENT DOCUMENTS

| | | |
|---|---|---|
| JP | 4940642 B2 | 3/2012 |
| JP | 5376709 B2 | 10/2013 |
| KR | 10-0721949 B1 | 5/2007 |
| KR | 10-0761128 B1 | 9/2007 |
| KR | 10-1577819 B1 | 12/2015 |
| KR | 10-1593099 B1 | 2/2016 |
| KR | 10-2016-0076007 A | 6/2016 |

\* cited by examiner

*Primary Examiner* — William Coleman
(74) *Attorney, Agent, or Firm* — Lewis Roca Rothgerber Christie LLP

(57) ABSTRACT

A display device includes a base substrate including a front surface having an active area and a peripheral area; a plurality of pixels; a plurality of first signal lines on the active area, each extending in a first direction, spaced apart from each other in a second direction crossing the first direction; a plurality of second signal lines, crossing the first signal line in an insulation manner; a plurality of first conductive patterns, spaced apart from each other in the first direction; a second conductive pattern overlapping the first conductive patterns and having a top surface waved in the first direction; and an optical member on the second conductive pattern, wherein the top surface of the second conductive pattern includes flat portions and protruding portions, that are alternately arranged in the first direction, and the protruding portions protrude from the flat portions toward the optical member.

20 Claims, 15 Drawing Sheets
(5 of 15 Drawing Sheet(s) Filed in Color)

DISPLAY DEVICE

CROSS-REFERENCE TO RELATED APPLICATION

This application claims priority to and the benefit of Korean Patent Application No. 10-2018-0017151, filed on Feb. 12, 2018, the entire content of which is hereby incorporated by reference.

FIELD

The present disclosure herein relates to a display device.

BACKGROUND

A display device includes signal lines for displaying an image and electronic elements connected to the signal lines. Each of the signal lines and the electronic elements includes a plurality of conductive patterns. The conductive patterns may contain an optically opaque material and thus be reflected by external light and seen from the outside. When the signal lines or the electronic elements are seen from the outside due to reflected light, visibility of an image displayed by the display device may be affected.

The above information disclosed in this Background section is only for enhancement of understanding of the background of the invention and therefore it may contain information that does not constitute prior art.

SUMMARY

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

Aspects of example embodiments of the present disclosure relate to a display device for preventing a conductive pattern from being seen due to external light reflection.

An embodiment of the inventive concept provides a display device that includes a base substrate including a front surface having an active area and a peripheral area, and a rear surface opposite to the front surface; a plurality of pixels on the active area; a plurality of first signal lines on the active area, each extending in a first direction, spaced apart from each other in a second direction crossing the first direction, and connected to the pixels; a plurality of second signal lines on the active area, crossing the first signal line in an insulation manner, and connected to the pixels; a plurality of first conductive patterns on the peripheral area, spaced apart from each other in the first direction, and connected to the second signal lines; a second conductive pattern overlapping the first conductive patterns on a plane in the peripheral area and having a top surface waved in the first direction; and an optical member on the second conductive pattern and overlapping the active area and the peripheral area. The top surface of the second conductive pattern includes flat portions and protruding portions that are alternately arranged in the first direction, and the protruding portions protrude from the flat portions toward the optical member, and a gap between the protruding portions in the first direction is about 1.5 μm.

In an embodiment, the flat portions may be parallel to the front surface of the base substrate.

In an embodiment, each of the protruding portions may include a connecting portion including a first inclined surface inclined from the front surface of the base substrate; and a second inclined surface inclined from the front surface of the base substrate, and an inclined angle formed between the base substrate and each of the first inclined surface and the second inclined surface is equal to or less than about 36° or equal to or greater than about 49°.

In an embodiment, each of the first inclined surface and the second inclined surface may have a linear shape on a cross-section perpendicular to the second direction.

In an embodiment, each of the first inclined surface and the second inclined surface may have a linear shape on a cross-section perpendicular to the second direction, and the inclined angle may be an inclined angle at each of points at which the first inclined surface and the second inclined surface contact the connecting portions.

In an embodiment, a gap between two consecutive protruding portions in the first direction may be equal to or greater than about 6 μm.

In an embodiment, the second signal lines may be connected to the pixels to transmit data signals to the pixels.

In an embodiment, the first conductive pattern may be on a different layer from the second signal lines.

In an embodiment, the display device may further include a plurality of third signal lines connected to the pixels, parallel to the second signal lines, and crossing the first signal lines in an insulation manner, and the third signal lines may be connected to the second conductive pattern.

In an embodiment, the second conductive pattern may be on the same layer as the second signal lines.

In an embodiment, the second conductive pattern may have a shape integrated with the third signal lines.

In an embodiment, each of the pixels may include a thin-film transistor and a light emitting element connected to the thin-film transistor, the second conductive pattern may include a first pattern and a second pattern that are spaced apart from each other on the plane, the third signal lines may receive an electrical signal from the first pattern, and the light emitting element may receive an electrical signal from the second pattern.

In an embodiment, the optical member may include at least one of a polarizing film and a retardation film.

In an embodiment of the inventive concept, a display device includes a base substrate including a front surface having an active area and a peripheral area and a rear surface opposite to the front surface; a plurality of pixels on the active area, each of the pixels including an organic light emitting element; gate lines located on the active area and connected to the pixels to provide gate signals; data lines crossing the gate lines in an insulation manner and connected to the pixels to provide data signals; power lines on the active area and connected to the pixels to provide first power signals; a first conductive pattern on the peripheral area and electrically connected to the data lines; a second conductive pattern on the peripheral area and connected to the first power lines while crossing the first conductive pattern in an insulation manner; and an optical member on the base substrate to cover the pixels and the second conductive pattern. A top surface of the second conductive pattern has an inclined surface that is inclined with respect to the front surface, and an inclined angle of the inclined surface is equal to or less than about 36° or equal to or greater than about 49°.

In an embodiment, the top surface of the second conductive pattern may include a plurality of protruding portions including the inclined surface and flat portions between two consecutive protruding portions to connect the protruding portions to each other.

In an embodiment, a gap between the two consecutive protruding portions may be equal to or greater than about 1.5 μm.

In an embodiment, the first conductive pattern may include a plurality of patterns spaced apart from each other in one direction, the protruding portions may be at positions corresponding to the patterns, and the flat portions may be at positions corresponding to spaces between the patterns.

In an embodiment, the first conductive pattern may be on the same layer as the gate lines, and the second conductive pattern may be on the same layer as the data lines.

In an embodiment, the first conductive pattern may be on a different layer from the gate lines and the data lines.

In an embodiment, an inclined angle of the inclined surface may be equal to or greater than about 60°.

BRIEF DESCRIPTION OF THE FIGURES

The patent or application file contains at least one drawing executed in color. Copies of this patent or patent application publication with color drawing(s) will be provided by the Office upon request and payment of the necessary fee.

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

The detailed description set forth below in connection with the appended drawings is intended as a description of some example embodiments of a display device provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the scope of the invention. As denoted elsewhere herein, like element numbers are intended to indicate like elements or features.

Figure 1A:
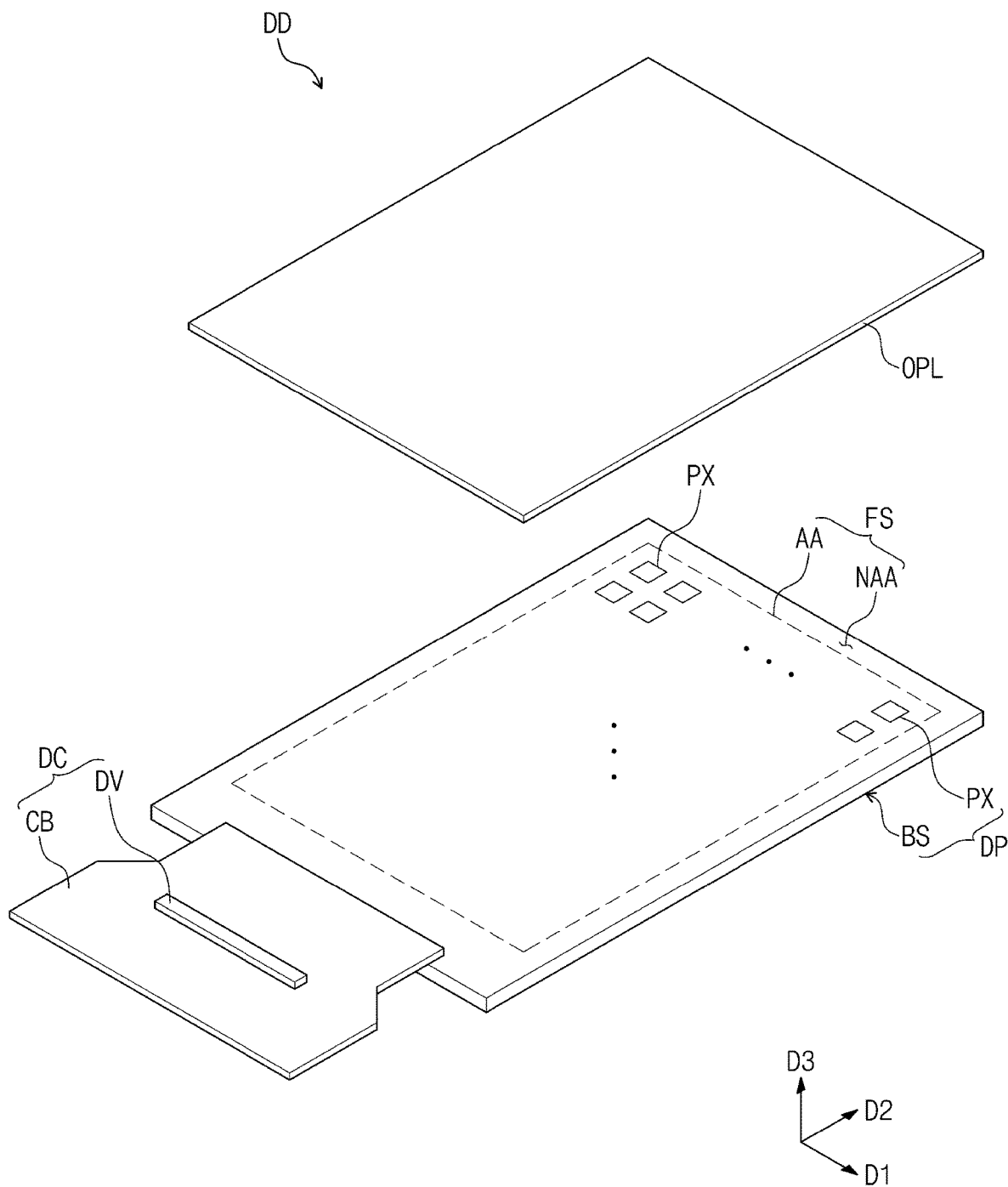
FIG. 1A is an exploded perspective view illustrating an electronic device according to an embodiment of the inventive concept.
Figure 1B:
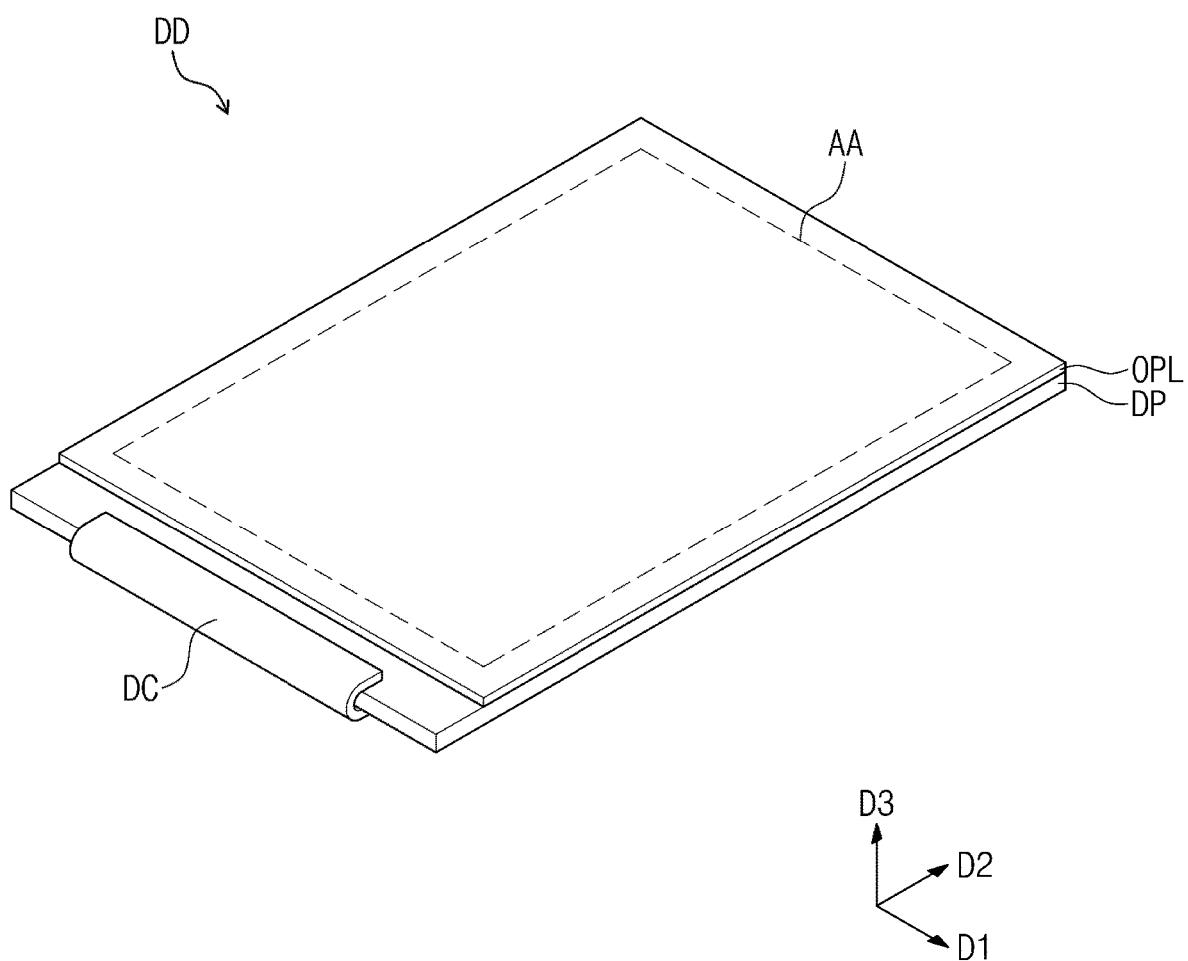
FIG. 1B is a perspective view illustrating a state in which the electronic device in FIG. 1A is coupled to a circuit board.
Figure 2:
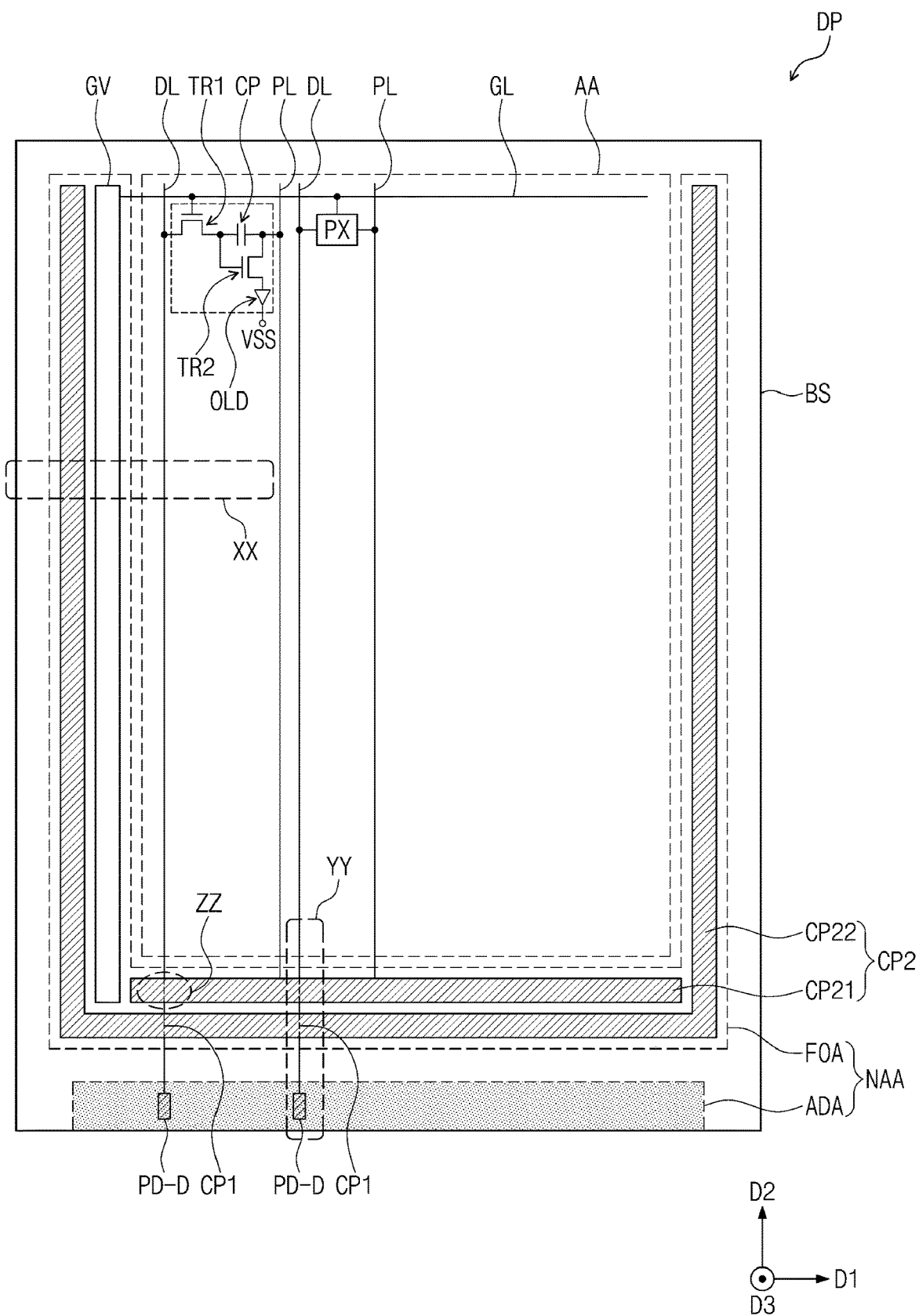
FIG. 2 is a schematic plan view illustrating a display panel according to an embodiment of the inventive concept.
Figure 3A:
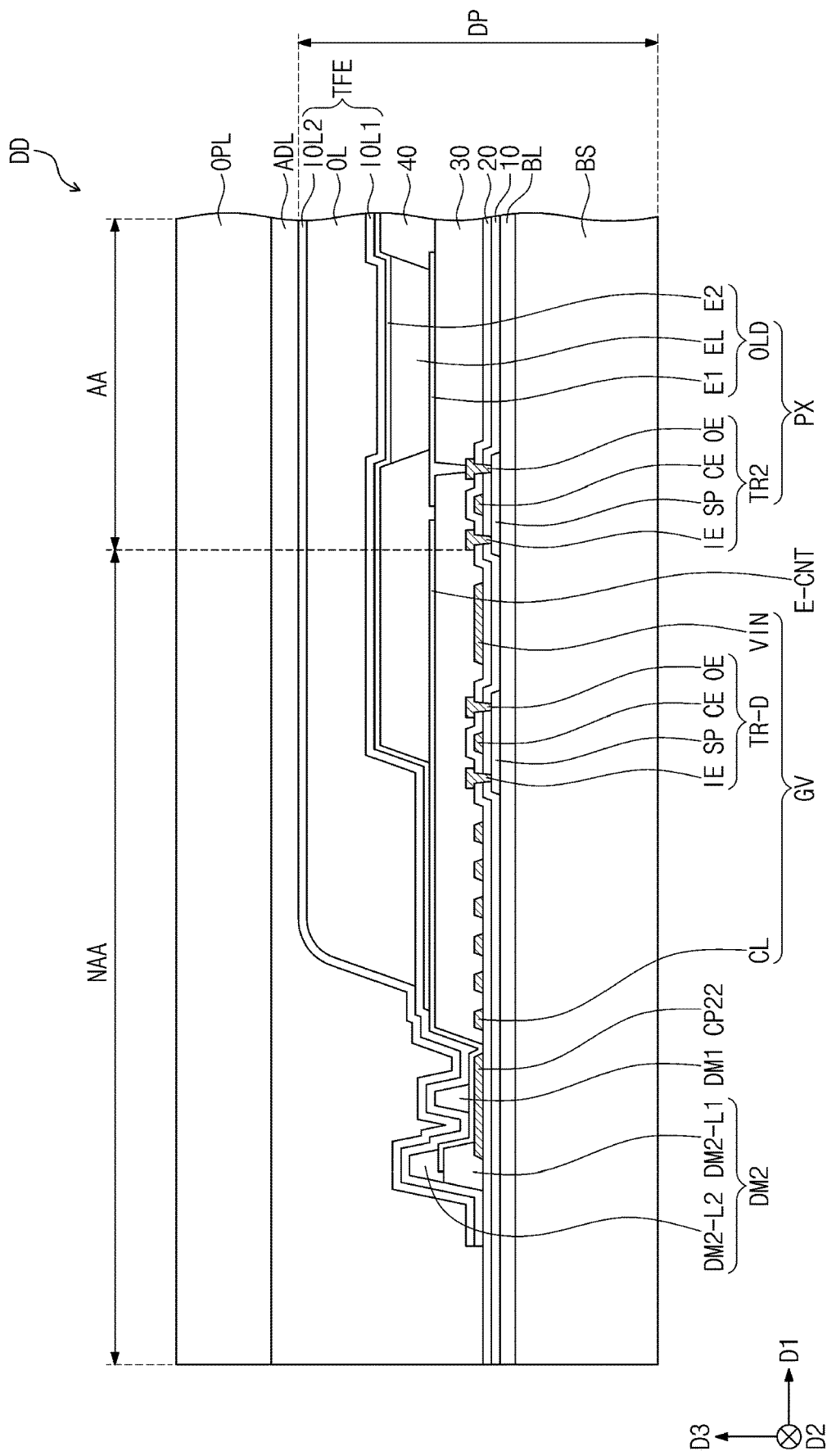
FIG. 3A is a schematic cross-sectional view illustrating a region XX in FIG. 2.
Figure 3B:
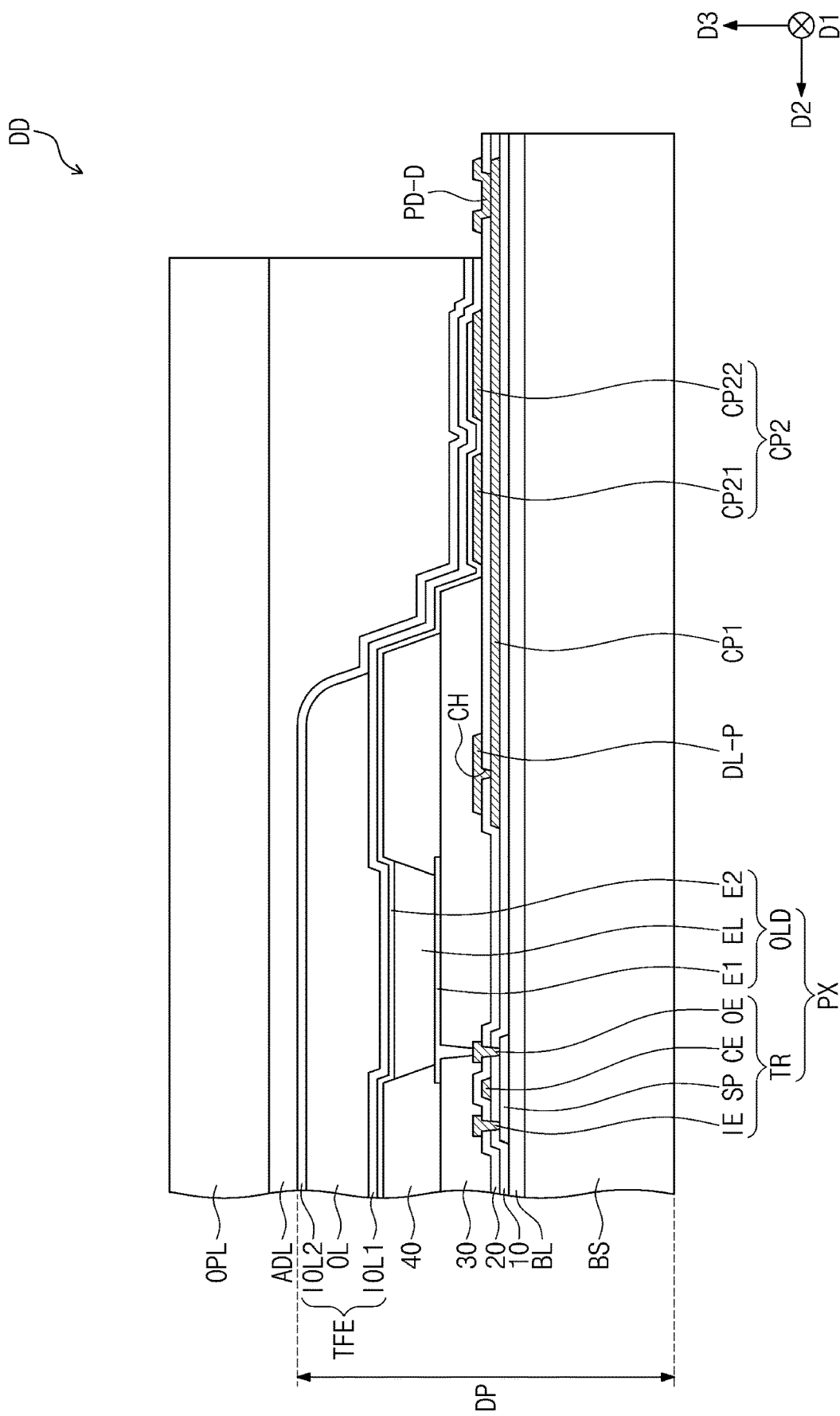
FIG. 3B is a schematic cross-sectional view illustrating a region YY in FIG. 2.

FIG. 1A is an exploded perspective view of an electronic device DD according to an embodiment of the inventive concept. FIG. 1B is a perspective view illustrating a state in which the electronic device of FIG. 1A is coupled to a circuit board. FIG. 2 is a schematic plan view illustrating a display panel according to an embodiment of the inventive concept. FIG. 3A is a schematic cross-sectional view illustrating a region XX in FIG. 2. FIG. 3B is a schematic cross-sectional view illustrating a region YY in FIG. 2.

In FIG. 2, a plan view of the display panel DP of FIG. 1A is illustrated for convenience of description (some components may be omitted). Hereinafter, an embodiment of the inventive concept will be described with reference to FIGS. 1A to 2.

In some example embodiments, as shown in FIGS. 1A-2, an electronic device DD includes a display panel DP, a circuit board DC, and an optical member OPL. The display panel DP displays an image on a front surface FS. The front surface FS may be parallel to a first direction D1 and a second direction D2 and perpendicular to a third direction D3. The front surface FS may be divided into an active area AA on which an image is displayed and a peripheral area NAA adjacent to the active area AA. In this embodiment, the peripheral area NAA may have a frame shape surrounding an edge of the active area AA. However, the embodiment of the inventive concept is not limited to the shape of the peripheral area NAA. For example, the peripheral area NAA may be defined to be adjacent to one side of the active area AA.

The display panel DP includes a base substrate BS, a plurality of pixels PX, a plurality of conductive patterns CP1 and CP2, a plurality of signal lines GL, DL, and PL, and a plurality of pads PD-D. The base substrate BS contains an insulating material. The base substrate BS may include a metal substrate, a glass substrate, a plastic substrate, or a flexible film.

The pixels PX are on the active area AA. The pixels PX may be arranged in the first direction D1 and the second direction D2, and spaced apart from each other in a matrix form. Each of the pixels PX receives an electrical signal to display light constituting an image.

Referring to FIG. 2, the pixels PX are connected to a plurality of signal lines. The signal lines may include gate lines GL, data lines DL, and power lines PL.

The gate lines GL may each extend in the first direction D1 and may be spaced apart from each other in the second direction D2. The gate lines GL transmit gate signals to the pixels PX.

The data lines DL may cross the gate lines GL in an insulation manner. According to example embodiments, the term "insulation manner" refers to that the signal lines crossing each other are insulated from each other. In the discussed embodiment, the data lines DL may each extend in the second direction D2 and may be spaced apart from each other in the first direction D1. The data lines DL transmit data signals to the pixels PX.

The power lines PL may cross the gate lines GL and the data lines DL in an insulation manner. In the discussed embodiment, the power lines PL may each extend in the first direction D1 and may be spaced apart from each other in the second direction D2. The power lines PL transmit first power signals to the pixels PX.

Each of the pixels PX may include a first transistor TR1, a second transistor TR2, a capacitor CP, and a light emitting element OLD. The first transistor TR1 is turned-on by a gate signal provided by a corresponding gate line of the gate lines GL and may supply a data signal provided by a corresponding data line of the data lines DL to the capacitor CP.

The capacitor CP charges a voltage corresponding to a potential difference between a data signal and a first power signal provided from the power line PL. The second transistor TR2 is turned-on by the voltage charged in the capacitor CP and may supply the first power signal from the power line PL to the light emitting element OLD.

Referring to FIGS. 2 to 3B, the second transistor TR2 may be on the base substrate BS and may include a control electrode CE, an input electrode 1E, an output electrode OE, and a semiconductor pattern SP. The control electrode CE is spaced apart from the semiconductor pattern SP and connected to one electrode of the capacitor CP with a first insulation layer 10 therebetween. Each of the input electrode IE and the output electrode OE is on a second insulation layer 20 and connected to the semiconductor pattern SP while passing through the first insulation layer 10 and the second insulation layer 20. The input electrode IE is connected to another electrode of the capacitor CP, and the output electrode OE is connected to the light emitting element OLD.

The light emitting element OLD is connected to each of the second transistor TR2 and a power terminal VSS. The light emitting element OLD includes a first electrode E1, a light emitting layer EL, and a second electrode E2. The first electrode E1 is on a third insulation layer 30 and connected to the second transistor TR2 while passing through the third insulation layer 30. The light emitting layer EL covers the first electrode E1 that is exposed by a fourth insulation layer 40. The light emitting layer EL may include a light emitting material for generating light in response to a potential difference. For example, the light emitting layer EL may include an organic light emitting material and/or quantum dots.

The second electrode E2 is on the light emitting layer EL. The second electrode E2 may overlap an entire surface of the active area AA. The second electrode E2 may extend from the active area AA to the peripheral area NAA and may be connected to a connection pattern E-CNT. The connection pattern E-CNT may correspond to the power terminal VSS.

The power terminal VSS provides a second power signal to the light emitting element OLD. The second power signal may have a potential different from that of the first power signal. The light emitting element OLD generates and emits light corresponding to a potential difference between a data signal provided from the second transistor TR2 and a second power signal provided from the power terminal VSS.

The peripheral area NAA may include a fan-out area FOA and a connection area ADA. The fan-out area FOA may be defined adjacent to the active area AA. The fan-out area FOA may be an area on which a first driving circuit GV, a first conductive pattern CP1, and a second conductive pattern CP2 are located.

The first driving circuit GV may include at least one driving transistor TR-D and a plurality of conductive lines CL and VIN. Although the driving transistor TR-D is illustrated to have the same structure as that of the second transistor TR2, the embodiment of the inventive concept is not limited thereto. The driving transistor TR-D may have a different structure from that of the second transistor TR2. The conductive lines CL and VIN are connected to the driving transistor TR-D or the like to constitute an electronic circuit. The first driving circuit GV may be a gate driving circuit connected to the gate lines GL.

The gate lines GL may extend from the active area AA and may be connected to the first driving circuit GV on the peripheral area NAA. The first driving circuit GV may provide an electrical signal, e.g., a gate signal, to each of the pixels PX through the gate lines GL.

In the discussed embodiment, although only one first driving circuit GV is provided, the embodiment of the inventive concept is not limited thereto. For example, the first driving circuit GV may be provided in plurality to be spaced apart from each other with the active area AA therebetween in the first direction D1. Also, in the discussed embodiment, although the first driving circuit GV is directly provided on the base substrate BS, the embodiment of the inventive concept is not limited thereto. For example, the first driving circuit GV may be mounted to a circuit board that is separately provided. Here, the first driving circuit GV may be attached to the display panel DP through a conductive adhesion member. The embodiment of the inventive concept is not limited to the embodiments of the first driving circuit GV. For example, the first driving circuit GV may include various different embodiments.

The first conductive pattern CP1 connects the data lines DL to the data pads PD-D. The first conductive pattern CP1 may include a plurality of line patterns each extending in the second direction D2 and spaced apart from each other in the first direction D1.

In the discussed embodiment, the first conductive pattern CP1 may be on a different layer from the data lines DL. For example, the first conductive pattern CP1 may be on the same layer as the control electrode CE, i.e., gate lines GL. Here, a data line connecting terminal DL-P extending from the data lines DL may be connected to the first conductive pattern CP1 between the first insulation layer 10 and the second insulation layer 20 through a contact hole CH defined in the second insulation layer 20.

However, the embodiment of the inventive concept is not limited thereto. For example, the first conductive pattern CP1 may be on the same layer as the data lines DL. For example, the first conductive pattern CP1 may be integrated with the data lines DL and provided as a portion of the data lines DL or may be connected to the data lines DL through a separate bridge pattern or the like. Although, the first conductive pattern CP1 may have various shapes, as long as the first conductive pattern CP1 may be connected to the data lines DL, the embodiment of the inventive concept is not limited thereto.

The second conductive pattern CP2 may include a first pattern CP21 and a second pattern CP22. The first pattern CP21 and the second pattern CP22 may be spaced apart from each other on a plane.

The first pattern CP21 may be on the fan-out area FOA and connected to the power lines PL extending from the active area AA. The power lines PL may be connected to one first pattern CP21 and provide first power signals having the same potential as each other to the pixels PX.

The second pattern CP22 is connected to the light emitting element OLD to provide a second power signal. The connection pattern E-CNT may extend upto the second pattern CP22 to electrically connect the second electrode E2 and the second pattern to each other. The power terminal VSS illustrated in each of the pixels PX may be substantially a terminal connected to the second pattern CP22. The second pattern CP22 may provide second power signals substantially having the same potential as each other to the pixels PX.

In the discussed embodiment, the second conductive pattern CP2 may be on a different layer from the first conductive pattern CP1. In the discussed embodiment, the second conductive pattern CP2 may be on the first conductive pattern CP1. The second conductive pattern CP2 may overlap the first conductive pattern CP1 on the plane in the fan-out area FOA.

The second conductive pattern CP2 and the first conductive pattern CP1 cross each other in an insulation manner in the fan-out area FOA. The first conductive pattern CP1 may cross each of the first pattern CP21 and the second pattern CP22 of the second conductive pattern CP2 in an insulation manner. This will be described later in more detail.

An encapsulation layer TFE is on the fourth insulation layer 40 to encapsulate the light emitting element OLD. The encapsulation layer TFE may include a first inorganic film IOL1, an organic film OL, and a second inorganic film IOL2, which are sequentially laminated in the third direction D3. However, the embodiment of the inventive concept is not limited thereto. For example, the encapsulation layer TFE may further include an inorganic layer and an organic layer, or at least one of the first inorganic film IOL1, the organic film OL, and the second inorganic film IOL2 may be omitted from the encapsulation layer TFE.

In the discussed embodiment, the organic film OL extends upto an area on which the first driving circuit GV is located while not overlapping the first pattern CP21 and the second pattern CP22. However, the embodiment of the inventive concept is not limited thereto. For example, the organic film OL may extend upto an area overlapping the second conductive pattern CP2 on the plane.

A plurality of pads PD-D may be on the connection area ADA. The pads PD-D are arranged while being spaced apart from each other in the first direction D1. The connection area ADA may be an area to which the circuit board DC is connected. The pads PD-D receive signals provided from the circuit board DC.

Each of the pads PD-D is connected to the first conductive pattern CP1. The pads PD-D may be data pads for providing data signals provided from the circuit board DC to the data lines DL.

In the discussed embodiment, the pads PD-D may be on a different layer from the first conductive pattern CP1. For example, the pads PD-D may be on the second insulation layer 20 and connected to the first conductive pattern CP1 while passing through the second insulation layer 20. However, the embodiment of the inventive concept is not limited thereto. For example, the pads PD-D may be on the same layer as the first conductive pattern CP1 or may be integrated with the first conductive pattern CP1.

Although not shown, pads connected to the second conductive pattern CP2 may be further provided on the connection area ADA. The first pattern CP21 and the second pattern CP22 may receive the first power signal and the second power signal through the pads.

The circuit board DC is on one side of the display panel DP and electrically connected to the display panel DR The circuit board DC may generate an electrical signal and provide the generated electrical signal to the display panel DP or receive and process an electrical signal generated from the display panel DR The circuit board DC may include a flexible film CB and a second driving circuit DV.

The flexible film CB is on the peripheral area NAA of the base substrate BS. The flexible film CB may be coupled to the base substrate BS through an adhesion member (not shown). The adhesion member may include a transparent adhesive agent or an anisotropic conductive film.

The second driving circuit DV may be mounted on the flexible film CB. The driving circuit DV is electrically connected to the flexible film CB through circuit lines (not shown) included in the flexible film CB. The flexible film CB may electrically connect the driving circuit DV to the display panel DP, and the driving circuit DV may generate an electrical signal to be provided to the display panel DP or process an electrical signal provided from the display panel DP.

The display panel DP further include a dam portion DM1 and DM2. The dam portion DM1 and DM2 may be disposed in the peripheral area NAA. When the organic layer OL of the encapsulation layer TFE is formed, the dam portion DM1 and DM2 may prevent the organic layer OL from overflowing from the active area AA toward the outside of the dam portion DM1 and DM2. The dam portion DM1 and DM2 may be disposed adjacent to at least one side of the active area AA. In an embodiment, the dam portion DM1 and DM2 may surround the the active area AA when viewed in a plan view. The dam portion DM1 and DM2 may include a first dam portion DM1 and a second dam portion DM2.

The first dam portion DM1 may be closer to the active area AA than the second dam portion DM2. In other words, the first dam portion DM1 may be disposed between the second dam portion DM2 and the active area AA. The first dam portion DM1 may overlap with the second pattern CP22 when viewed in a plan view. In the present embodiment, the connection electrode E-CNT may extend between the first dam portion DM1 and the second pattern CP22 when viewed in a cross-sectional view.

In the present embodiment, the first dam portion DM1 may include the same material as the fourth insulating layer 40 and may be formed simultaneously with the fourth insulating layer 40 by using one mask. Thus, an additional process for forming the first dam portion DM1 may not be required. As a result, a process cost may be reduced and processes may be simplified.

The second dam portion DM2 may be disposed outside the first dam portion DM1. The second dam portion DM2 may be disposed to cover the second pattern CP22. In the present embodiment, the second dam portion DM2 may have a double layer structure including a first layer DM2-L1 and a second layer DM2-L2. For example, the first layer DM2-L1 may be formed simultaneously with the third insulating layer 30, and the second layer DM2-L2 may be formed simultaneously with the fourth insulating layer 40. Thus, the second dam portion DM2 may be easily formed without an additional process.

In the present embodiment, a portion of the connection electrode E-CNT may be disposed to overlap with a top surface of the first layer DM2-L1 of the second dam portion DM2. An end of the connection electrode E-CNT may be disposed between the first layer DM2-L1 and the second layer DM2-L2. However, embodiments of the inventive concepts are not limited thereto. In another embodiment, the connection electrode E-CNT may not extend to the second dam portion DM2.

The optical member OPL is on the display panel DP. Also, the electronic device DD according to an embodiment of the inventive concept may further include an adhesion member ADL. The adhesion member ADL is located between the display panel DP and the optical member OPL and physically couples the optical member OPL and the display panel DP to each other. The adhesion member ADL may include an optical clear adhesive (OCA), an optical clear resin (OCR), or a pressure sensitive adhesive (PSA).

The optical member OPL may be optically clear. For example, an image displayed on the active area AA may be transmitted through the optical member OPL and easily seen to a user.

The optical member OPL may decrease an external light reflectance. The optical member OPL may decrease an incidence rate of external light into the display panel DP or, when the external light incident through the optical member OPL is reflected by components of the display panel DP, may decrease a transmittance of the reflected light. For example, the optical member OPL may include at least one of a polarizing film and a retardation film.

The optical member OPL covers the active area AA and the peripheral area NAA. Accordingly, the optical member OPL may overlap the fan-out area FOA as well as the active area AA on the plane.

Thus, the second conductive pattern CP2 may be on the fan-out area FOA and may be covered by the optical member OPL on the plane. Here, the external light incident through the optical member OPL may be reflected by the second conductive pattern CP2 and transmitted through or blocked by the optical member OPL. The display device DD, according to an embodiment of the inventive concept, may control the shape of the second conductive pattern CP2 to decrease the external light reflectance of the second conductive pattern CP2 and allow the light reflected by the second conductive pattern CP2 to be easily blocked by the optical member OPL. Accordingly, an external visibility of the second conductive pattern CP2 in the fan-out area FOA may decrease. This will be described later in detail.

Figure 4A:
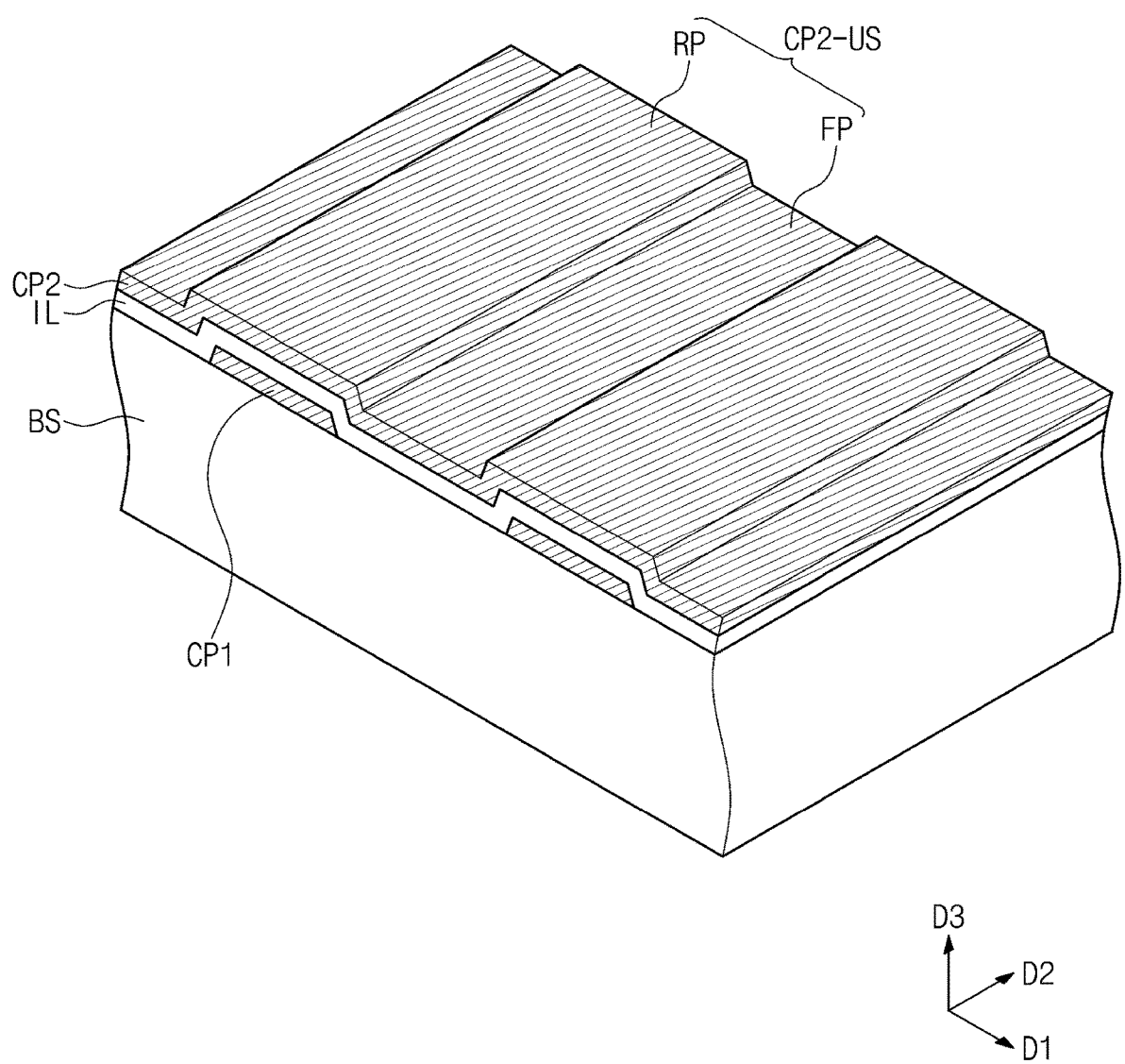
FIG. 4A is a schematic cross-sectional view illustrating a region ZZ in FIG. 2.
Figure 4B:
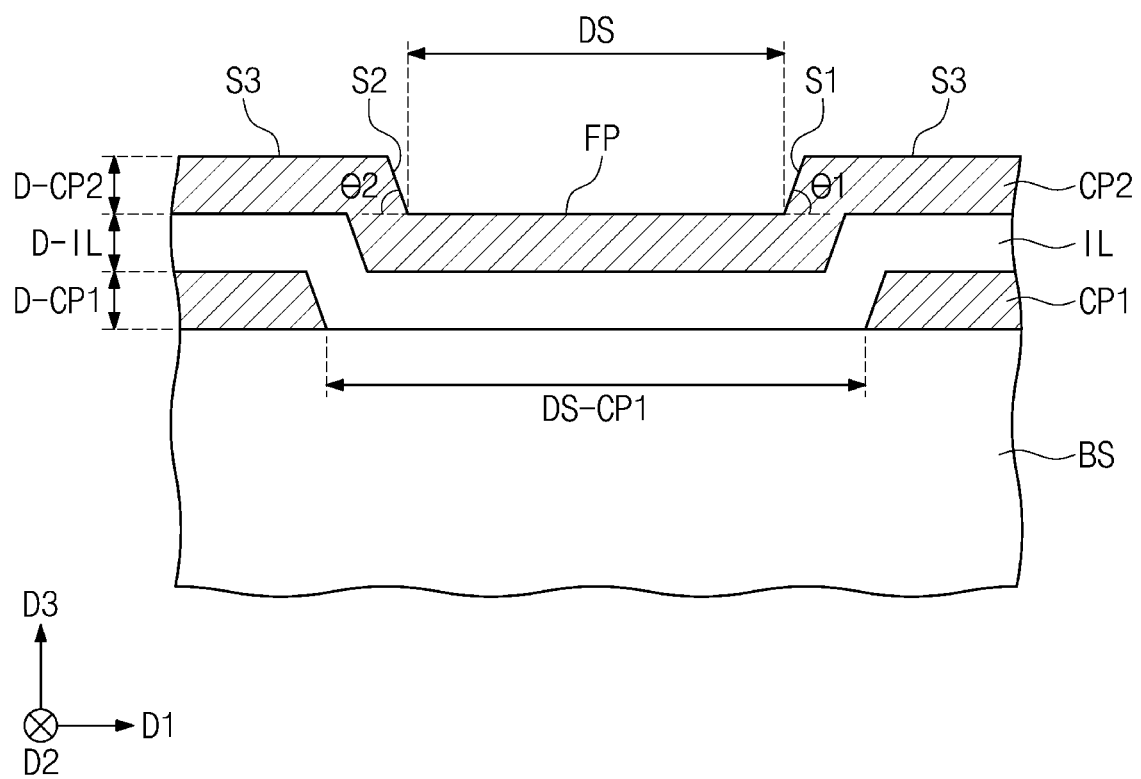
FIG. 4B is a cross-sectional view illustrating a portion of FIG. 4A.
Figure 5A:
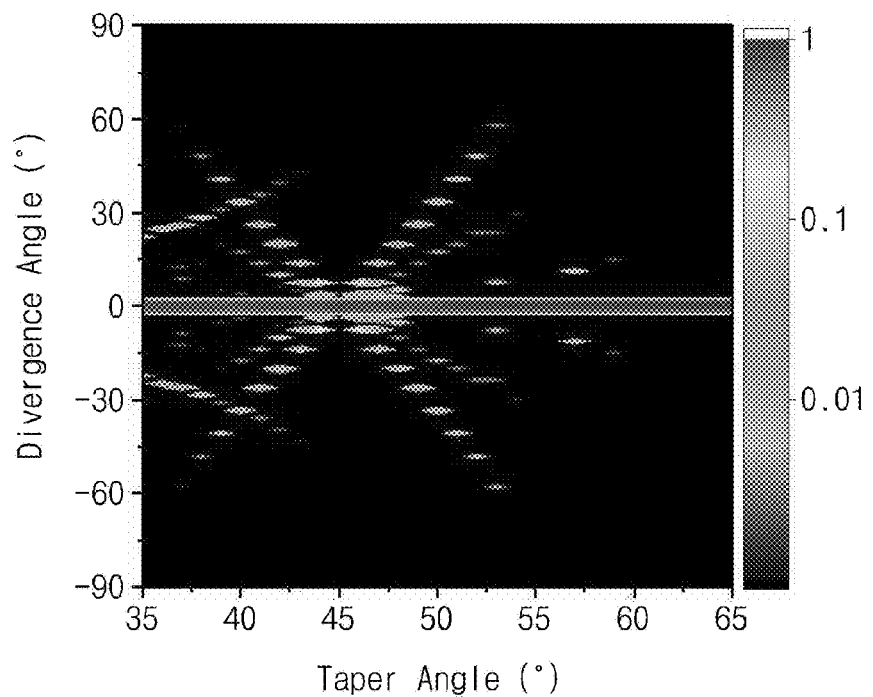
FIG. 5A is a graph showing a result obtained by a light divergence angle experiment according to a waviness inclined angle of a top surface of a conductive pattern.
Figure 5B:
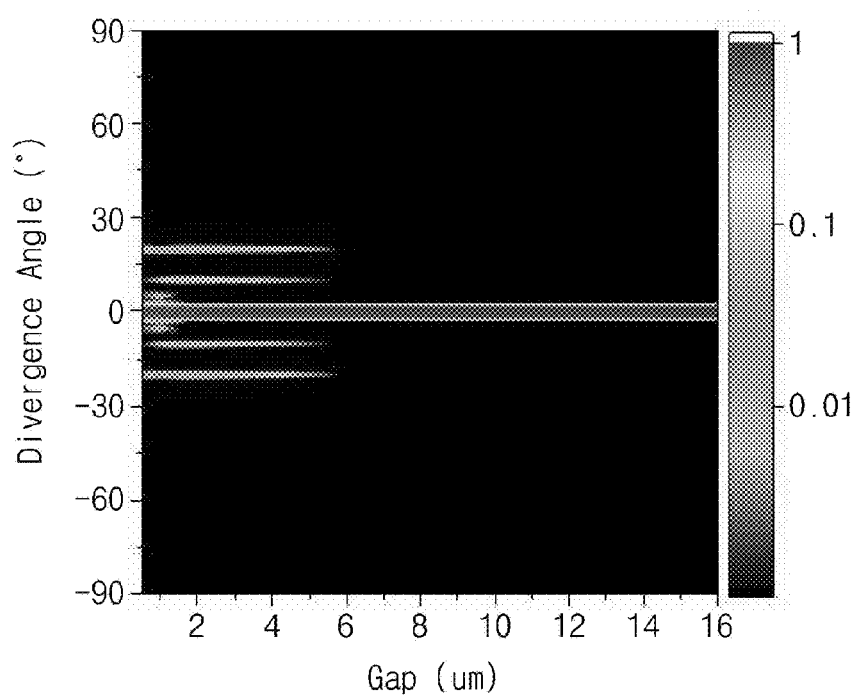
FIG. 5B is a graph showing a result obtained by a light divergence angle experiment according to a waviness gap of the top surface of the conductive pattern.

FIG. 4A is a schematic cross-sectional view illustrating a region ZZ in FIG. 2. FIG. 4B is a cross-sectional view illustrating a portion of FIG. 4A. FIG. 5A is a graph showing a result of a light divergence angle experiment according to a waviness inclined angle of a top surface of a conductive pattern, and FIG. 5B is a graph showing a result of a light divergence angle experiment according to a waviness gap of the top surface of the conductive pattern. For concise description, some components of FIGS. 3A and 3B are omitted in FIGS. 4A and 4B, and experimental results of the light divergence angle with respect to the second conductive pattern CP2 are shown in FIGS. 5A and 5B. Hereinafter, an embodiment of the inventive concept will be described with reference to FIGS. 4A to 5B.

As illustrated in FIG. 4A, the first conductive pattern CP1 and the second conductive pattern CP2 overlap each other in the fan-out area FOA (See, for example, FIG. 2). The first conductive pattern CP1 and the second conductive pattern CP2 cross each other in an insulation manner with an insulation layer (e.g., a predetermined insulation layer IL) therebetween on a plane defined by the first direction D1 and the second direction D2. The insulation layer IL may correspond to the second insulation layer 20 in FIG. 3B, for example.

Referring to FIGS. 4A and 4B, the second conductive pattern CP2 may have a waved top surface. The second conductive pattern CP2 has a top surface CP2-US including protruding portions RP and flat portions FP. The protruding portions RP and the flat portions FP form waviness.

The protruding portions RP and the flat portions FP are each provided in plurality and alternately arranged in the first direction D1. Each of the flat portions FP is located between two adjacent protruding portions RP and connects the adjacent protruding RP portion to each other.

Accordingly, the protruding portions RP may be spaced at a gap (e.g., a predetermined gap) from each other in the first direction D1. A gap DS between any two protruding portions RP may correspond to a width of the flat portion FP in the first direction D1. The gap DS between the protruding portions RP may be variously designed. As the gap DS between the protruding portions RP increases, a density of the protruding portions RP occupying the top surface CP2-US may decrease, and as the gap DS between the protruding portions RP decreases, the density of the protruding portions RP occupying the top surface CP2-US may increase.

Each of the protruding portions RP may protrude from the flat portion FP in the third direction D3. Each of the protruding portions RP may include a first inclined surface S1, a second inclined surface S2, and a flat surface S3. Each of the first inclined surface S1 and the second inclined surface S2 is inclined from the flat portion FP, and the flat surface S3 may be substantially parallel to the flat portion FP. For example, the first and second inclined surfaces S1 and S2 are connected to the flat portion FP and form protruding portions different from each other as illustrated in FIG. 4B.

Each of the first inclined surface S1 and the second inclined surface S2 are adjacent to the flat portion FB. Each of the first inclined surface S1 and the second inclined surface S2 may connect the flat surface S3 to the flat portion FR Each of the first inclined surface S1 and the second inclined surface S2 may have a linear shape on a cross-section perpendicular to the second direction D2.

The first inclined surface S1 is inclined at a first angle $\theta 1$ with respect to the flat portion FP, and the second inclined surface S2 is inclined at a second angle $\theta 2$ with respect to the flat portion FP. The first angle $\theta 1$ and the second angle $\theta 2$ may be independent from each other. Accordingly, the first angle $\theta 1$ and the second angle $\theta 2$ may be the same as or different from each other. Each of the protruding portions RP may have a degree of protrusion that may be controlled according to the first angle $\theta 1$ and the second angle $\theta 2$.

The top surface CP2-US of the second conductive pattern may have a flatness that may be designed according to the first angle $\theta 1$, the second angle $\theta 2$, and the gap DS between the protruding portions RP. In some example embodiments, as the first angle $\theta 1$ and the second angle $\theta 2$ increase and the gap DS between the two consecutive protruding portions decreases, the waved degree of the top surface CP2-US of the second conductive pattern may increase.

The waved degree of the top surface CP2-US of the second conductive pattern may be substantially controlled by the second conductive pattern CP2 and components located below the second conductive pattern CP2. For example, a thickness D-CP1 of the first conductive pattern CP1, a thickness D-IL of the insulation layer, a thickness D-CP2 of the second conductive pattern CP2, and a planar shape of the first conductive pattern CP1 may affect the waved degree of the top surface CP2-US of the second conductive pattern.

In some example embodiments, the first angle θ1 and the second angle θ2 may be varied according to the thickness D-CP1 of the first conductive pattern CP1, the thickness D-IL of the insulation layer, and the thickness D-CP2 of the second conductive pattern CP2. Also, although the thickness D-CP1 of the first conductive pattern CP1, the thickness D-IL of the insulation layer IL, and the thickness D-CP2 of the second conductive pattern CP2 are evenly maintained, the first angle θ1 and the second angle θ2 may be varied according to a cross-sectional shape of the first conductive pattern CP1, e.g., a tapered or rectangular shape on the cross-section.

Also, the gap DS of the second conductive pattern may be varied according to the gap DS-CP1 between patterns constituting the first conductive pattern CP1. Also, although the gap DS-CP1 between patterns constituting the first conductive pattern CP1 is evenly maintained, the gap of the second conductive pattern may be varied according to the thickness D-CP1 of the first conductive pattern CP1, the thickness D-IL of the insulation layer IL, and the thickness D-CP2 of the second conductive pattern CP2.

When external light incident onto the second conductive pattern CP2 is reflected by the second conductive pattern CP2, the waved degree of the top surface CP2-US of the second conductive pattern CP2 may affect characteristics of the reflected light. The reflected light that is reflected by and emitted from the second conductive pattern CP2 may have an intensity and a divergence angle, that are varied according to the waved degree of the top surface CP2-US of the second conductive pattern CP2.

The reflected light that is reflected by and emitted from the second conductive pattern CP2, passes through the optical member OPL and then reaches an external user. According to the characteristics of the reflected light that is reflected by and emitted from the second conductive pattern CP2, a degree of light shielding by the optical member OPL may be determined, and this may affect the degree of the second conductive pattern CP2 to be seen from the outside. Hereinafter, the waved degree of the top surface CP2-US of the second conductive pattern and the characteristics of the reflected light will be described in detail with reference to FIGS. 5A and 5B.

FIG. 5A is a graph showing a divergence angle distribution of reflected light according to an inclined angle of the top surface CP2-US of the second conductive pattern. In FIGS. 5A and 5B, a relative ratio of the reflected light according to a divergence angle when an amount of light reflected in an area having a divergence angle of 0° is illustrated in color.

Referring to FIG. 5A, points indicating existence of light reflected from an inclined surface having a numerical range equal to or greater than about 60° are not marked. This represents a state in which light reflected and emitted from an inclined surface having a numerical range equal to or greater than about 60° does not exist, or a divergence angle of the reflected light is out of a range of ±90°. The light having a divergence angle out of the range of ±90° may be blocked by the optical member OPL. Accordingly, as the inclined surfaces formed on the top surface CP2-US of the second conductive pattern are designed to have an angle of about 60° or more, the second conductive pattern CP2 may not be seen due to the external light reflection.

In comparison, points indicating existence of light reflected from an inclined surface having a numerical range less than about 60° may be increasingly displayed. For example, as the light reflected from an inclined surface approaches an angle of about 45°, distribution of points having a divergence angle of about 0° may gradually increase. As the divergence angle approaches about 0°, a degree of the reflected light to be seen from the outside increases.

According to an embodiment of the inventive concept, as the top surface CP2-US of the second conductive pattern includes the protruding portions RP that are controlled to have the first angle θ1 and the second angle θ2 equal to or greater than about 60°, the external light reflectance of the top surface CP2-US of the second conductive pattern may decrease. Accordingly, as the inclined angles of the waved portions are controlled even when the second conductive pattern CP2 has the waved top surface, the problem of the second conductive pattern CP2 being seen due to the external light reflection in the fan-out area FOA (See, for example, FIG. 2) may be resolved.

Referring to FIG. 5B, bars indicating existence of light in a numerical range equal to or greater than about 6 μm are not displayed. On the other hand, the bars indicating existence of light in a numerical range less than about 6 μm are displayed. The distribution of divergence angles of external light when a gap is adjacent to about 6 μm shows two peaks having about ±20° and ±10°, and when the gap is equal to or less than about 2 μm, light having a divergence angle of about 0° is reflected.

According to an embodiment of the inventive concept, as the top surface CP2-US of the second conductive pattern includes the protruding portions RP that are spaced by a gap that is equal to or greater than about 6 μm from each other, the external light reflectance of the top surface CP2-US of the second conductive pattern may decrease. Accordingly, as the inclined angles of the waved portions are controlled even when the second conductive pattern CP2 has the waved top surface, the problem of the second conductive pattern CP2 being seen due to the external light reflection in the fan-out area FOA (See, for example, FIG. 2) may be resolved.

Also, because the gap DS between the protruding portions RP is determined by the first conductive pattern CP1 located therebelow, as the gap DS between the protruding portions RP increases, a gap between patterns constituting the first conductive pattern CP1 may increase. In some example embodiments, because the patterns constituting the first conductive pattern CP1 correspond to the power lines for providing the same signal to each of the pixel rows, as the gap DS between the protruding portions RP increases, it may be difficult to realize a high resolution.

Accordingly, the gap DS between the protruding portions RP may correspond to a width of one pixel in the first direction D1 and a gap between the data lines DL. For example, the gap DS between the protruding portions RP may be equal to or less than about 25 μm. However, the embodiment of the inventive concept is not limited thereto. For example, an upper limit of the gap DS between the protruding portions RP may be controlled to have various sizes while corresponding to the width of each of the pixels.

According to an embodiment of the inventive concept, through the controlling of the gap DS between the protruding portions RP, the visibility of the display device according to the external light reflection may be enhanced, and the high resolution of the display device may be realized.

Figure 6:
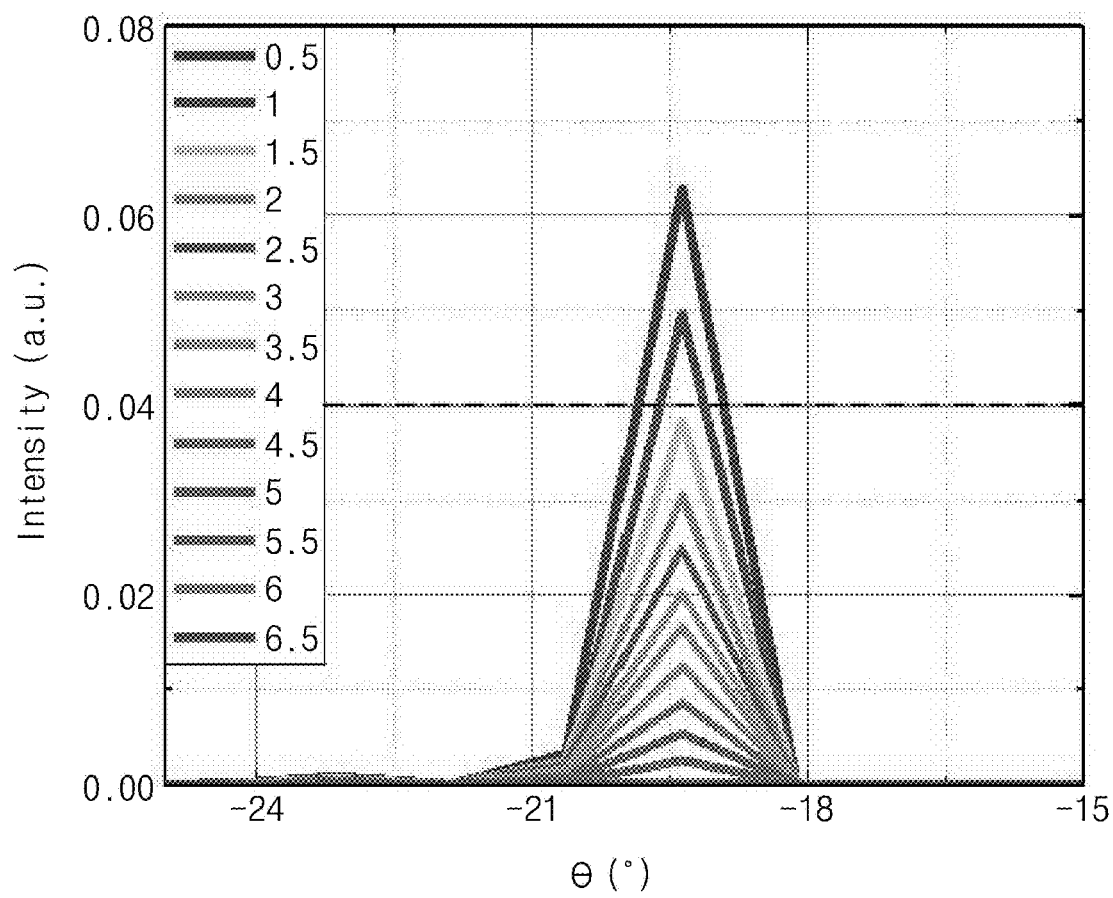
FIG. 6 is a graph showing a light intensity according to a divergence angle of reflected light according to an embodiment of the inventive concept.

FIG. 6 is a graph showing light intensity according to a divergence angle of reflected light according to an embodiment of the inventive concept. In FIG. 6, graphs according to the gap DS (See, for example, FIG. 4B) between the protruding portions are illustrated in different colors to be distinguished, and the light intensities within a range of about −24° to −25° are illustrated in correspondence to the intensities of light having a divergence angle of ±20° in FIG. 5B. Also, the intensity of light in FIG. 6 is illustrated by a relative intensity (hereinafter, referred to as an arbitrary unit (a.u.)). Hereinafter, embodiments of the inventive concept will be described with reference to FIG. 6.

As illustrated in FIG. 6, the intensity of light reflected by the second conductive pattern CP2 (See, for example, FIG. 4B) is varied according to the gap DS between the protruding portions. Here, when the gap DS between the protruding portions is equal to or greater than about 1.5 μm, the intensity of light is equal to or less than about 0.04, and when the gap DS between the protruding portions is less than about 1.5 μm, the intensity of light is equal to or greater than about 0.04.

Assuming that the light intensity at a point having a divergence angle of 0° is about 1.0, in case of a light intensity equal to or less than about 0.04, reflected light may exist, but may not be seen by eyes of a user. In consideration that the display device according to an embodiment of the inventive concept is used by a user, when the reflected light exists, but is not seen by the user, the problem of the second conductive pattern CP2 being seen according to the external light reflection may be resolved.

According to an embodiment of the inventive concept, as the gap DS between the protruding portions is controlled to be equal to or greater than about 1.5 μm, the problem of the second conductive pattern CP2 being seen according to the external light reflection may be resolved. Also, according to an embodiment of the inventive concept, as the gap DS between the protruding portions may be controlled to be, desirably, equal to or greater than about 6 μm, the external light reflection of the second conductive pattern CP2 may be blocked, and thus the problem of the second conductive pattern CP2 being seen according to the external light reflection may be resolved.

Figure 7A:
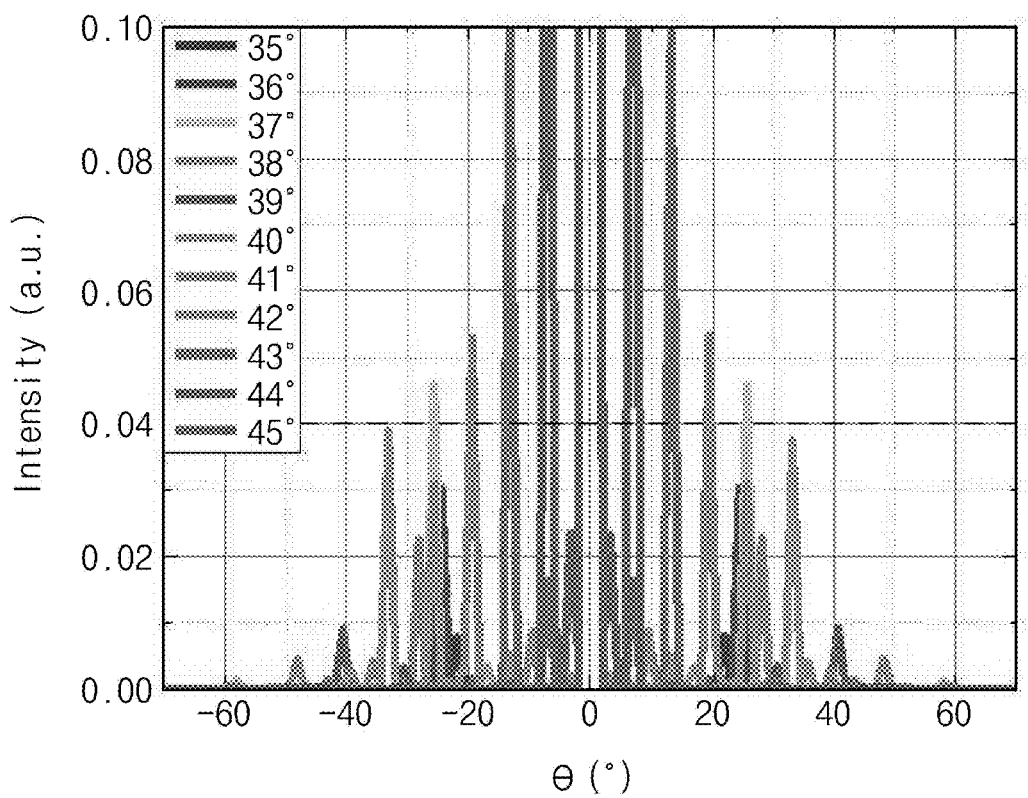
FIGS. 7A to 7C are graphs showing a light intensity according to a divergence angle of reflected light according to an embodiment of the inventive concept.
Figure 7B:
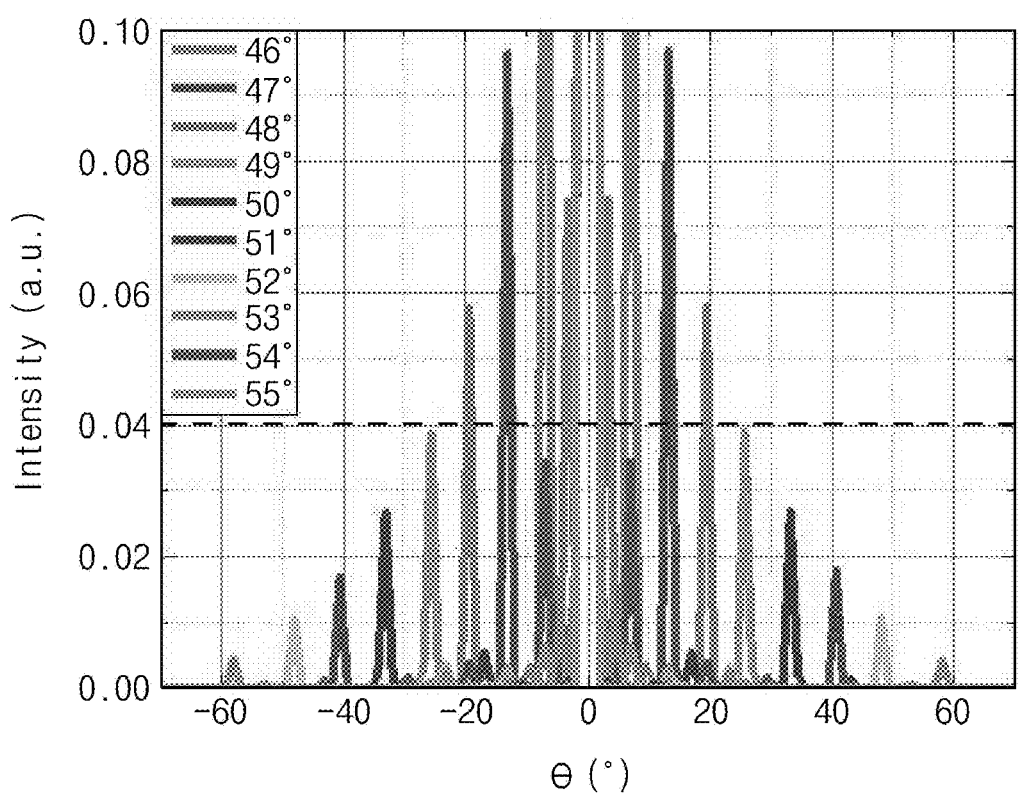
Figure 7C:
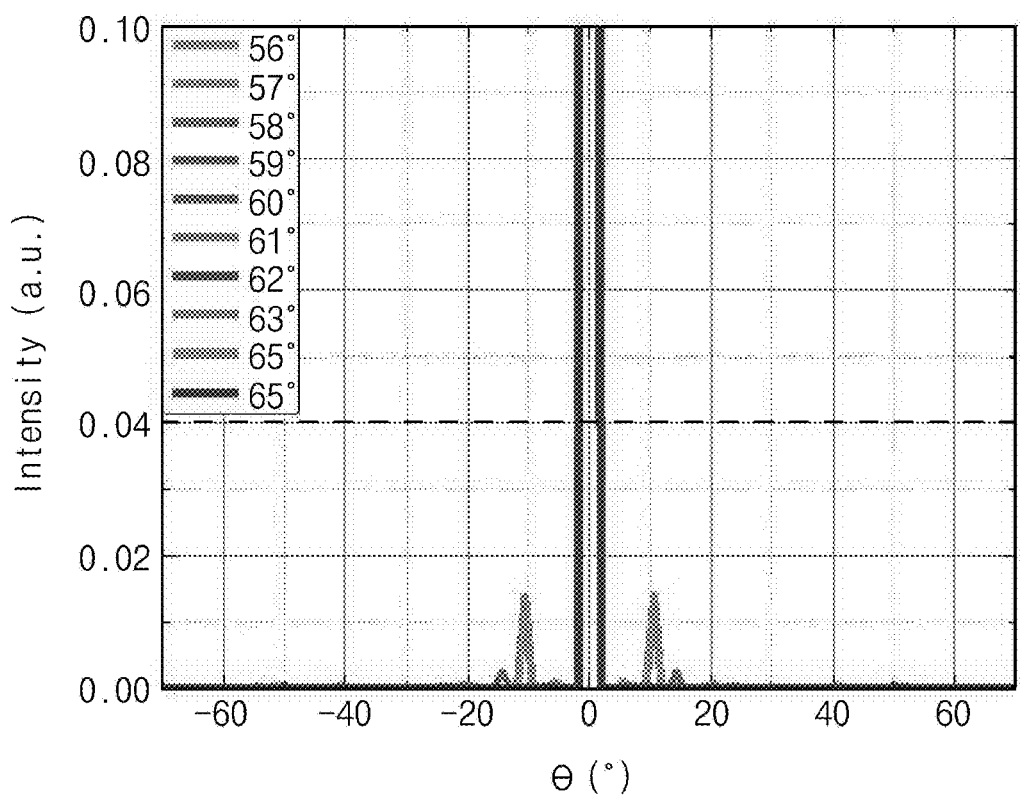

FIGS. 7A to 7C are graphs showing light intensities on the basis of divergence angles of reflected light according to an embodiment of the inventive concept. In FIGS. 7A to 7C, graphs of light reflected according to inclined angles of the protruding portions of the second conductive pattern CP2, i.e., the first inclined angle θ1 or the second inclined angle θ1, are illustrated in different colors to be distinguished, and relative intensities of the reflected light having divergence angles of about ±60°. FIG. 7A illustrates light intensities according to divergence angles in embodiments including protruding portions that are inclined at angles of about 35° to about 45°. FIG. 7B illustrates light intensities according to divergence angles in embodiments including protruding portions that are inclined at angles of about 46° to about 55°. Further, FIG. 7A illustrates light intensities according to divergence angles in embodiments including protruding portions that are inclined at angles of about 56° to about 65°. Hereinafter, an embodiment of the inventive concept will be described with reference to FIGS. 7A to 7C.

As shown in FIGS. 7A to 7C, each of the graphs may have a shape in which the light intensities reflected from the second conductive pattern CP2 are symmetric with respect to a point having a divergence angle of about 0°. As the divergence angle approaches about 0°, the light intensities mostly gradually increase, and, as the divergence angle is away from about 0°, the light intensities mostly gradually decrease. In each of the graphs, a portion having a highest intensity may be a main peak, and an angle at which the main peak is shown may be a divergence angle of light reflected from the inclined surface of the corresponding inclined angle.

Referring to FIG. 7A, a main peak of light reflected from an inclined surface that is inclined at an angle of about 35° is shown at a divergence angle of about ±5° and has an intensity equal to or less than about 0.02. A main peak of light reflected from an inclined surface that is inclined at an angle of about 36° is shown at a divergence angle of about ±25° and has an intensity equal to or less than about 0.03.

A main peak of light reflected from an inclined surface that is inclined at an angle of about 37° is shown at a divergence angle of about ±27° and has an intensity equal to or less than about 0.05. In the discussed embodiment, a main peak of light reflected from an inclined surface that is inclined at an angle of about 36° or less has an intensity equal to or less than about 0.04, and, as described above, this intensity is not seen by eyes of the user.

Referring to FIG. 7B, a main peak of light reflected from an inclined surface that is inclined at an angle range of about 46° to about 48° has an intensity equal to or greater than about 0.04, and a main peak of light reflected from an inclined surface that is inclined at an angle range of about 49° to about 55° has an intensity equal to or less than about 0.04. For example, a main peak of light reflected from the inclined surface that is inclined at an angle of about 46° is shown at a divergence angle of about ±10° and has an intensity equal to or less than about 0.1. A main peak of light reflected from an inclined surface that is inclined at an angle of about 47° is shown at a divergence angle of about ±13° and has an intensity of about 0.1. A main peak of light reflected from an inclined surface that is inclined at an angle of about 48° is shown at a divergence angle of about 0° and has an intensity equal to or greater than about 0.1.

On the other hand, a main peak of light reflected from the inclined surface that is inclined at an angle of about 49° is shown at a divergence angle of about ±10° and has an intensity equal to or less than about 0.04. Main peaks of light reflected from inclined surface in an angle range of about 50° to about 55° also have intensities equal to or less than about 0.04.

Referring to FIG. 7C, all of main peaks of light reflected from inclined surface in an angle range of about 56° to about 65° have intensities equal to or less than about 0.04. All of main peaks of light reflected from inclined surface in an angle range of about 56° to about 59° have intensities equal to or less than about 0.04, and graphs of light reflected from inclined surface in an angle range of about 60° to about 65° are not illustrated, as the light having a divergence angle in a range of ±90° may not be reflected from inclined surfaces that are inclined at an angle of about 60° or more.

According to an embodiment of the inventive concept, although the second conductive pattern CP2 includes the protruding portions RP having an inclined surface in an angle range of about 60° or less, when an angle of an inclined surface is about 36° or less or about 49° or more, the problem of the second conductive pattern CP2 being seen due to the external light reflection may be resolved. When an angle of an inclined surface is about 36° or less or about 49° or more, unlike a case of an inclined surface having an inclined angle of about 60°, reflected light that is reflected from an inclined surface to have a divergence angle of about ±90°, may be generated. However, in such a case, because a relative intensity is equal to or less than about 0.04, the second conductive pattern CP2 may not be seen to the user.

According to an embodiment of the inventive concept, as the second conductive pattern CP2 is designed to include protruding portions that are controlled to have an angle of about 36° or less or about 49° or more, the problem of the second conductive pattern CP2 being seen in the fan-out area FOA (See, for example, FIG. 2) due to the external light reflection may be resolved.

Figure 8A:
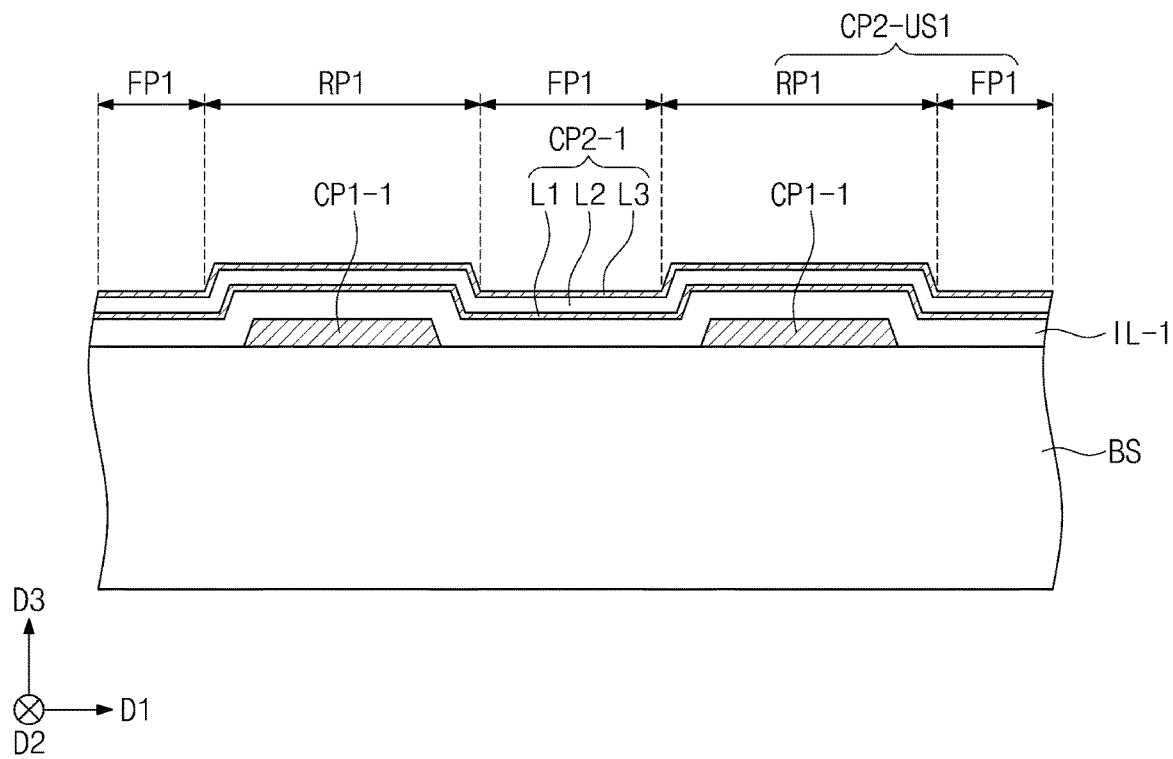
FIGS. 8A and 8B are cross-sectional views illustrating a portion of an electronic device according to an embodiment of the inventive concept.
Figure 8B:
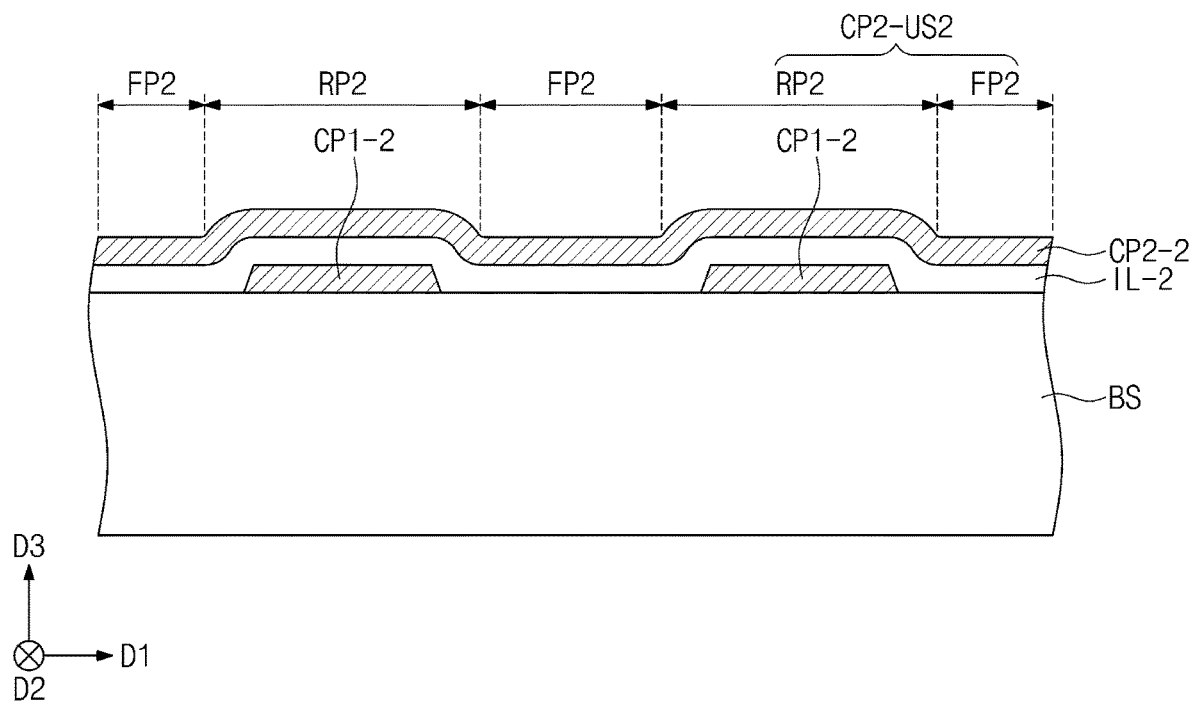

FIGS. 8A and 8B are cross-sectional views illustrating a portion of display device according to an embodiment of the inventive concept. For ease of description, only components corresponding to those in FIG. 4A are illustrated in FIGS. 8A and 8B. Hereinafter, an embodiment of the inventive concept will be described with reference to FIGS. 8A to 8B.

As illustrated in FIG. 8A, the display panel may include a first conductive pattern CP1-1 including a plurality of patterns that are spaced apart from each other in the first direction D1, a second conductive pattern CP2-1 overlapping the first conductive pattern CP1-1 on a plane, and an insulation layer IL-1 located between the first conductive pattern CP1-1 and the second conductive pattern CP1-2. The first conductive pattern CP1-1 and the insulation layer IL-1 are substantially the same as the first conductive pattern CP1 and the insulation layer IL (See, for example, FIG. 4A). Hereinafter, redundant description will be omitted.

In the discussed embodiment, the second conductive pattern CP2-1 may contain a material different from that of the first conductive pattern CP1-1 and has a structure different from that of the first conductive pattern CP1-1. For example, the second conductive pattern CP2-1 may include a first layer L1, a second layer L2, and a third layer L3, which are laminated in the third direction D3. The second layer L2 may contain a material different from that of each of the first layer L1 and the third layer L3. The second layer L2 may contain a material having higher conductivity relative to that of each of the first layer L1 and the third layer L3.

The first layer L1, the second layer L2, and the third layer L3 may form a waved shape along the first direction D1 while covering the first conductive pattern CP1-1. The second conductive pattern CP2-1 may have a top surface CP2-US1 that is defined by a top surface of the third layer L3. The top surface CP2-US1 of the second conductive pattern CP2-1 includes a plurality of protruding portions RP1 and a plurality of flat portions FP1 that are arranged alternately with the protruding portions RP1 in the first direction D1. The protruding portions RP1 and the flat portions FP1 form a waved surface on the top surface CP2-US1 of the second conductive pattern. Detailed description regarding this overlaps that of FIGS. 4A and 4B, and thus, hereinafter, will be omitted.

Alternatively, as illustrated in FIG. 8B, the display panel may include a first conductive pattern CP1-2 including a plurality of patterns that are spaced apart from each other in the first direction D1, a second conductive pattern CP2-2 overlapping the first conductive pattern CP1-2 on a plane, and an insulation layer IL-2 located between the first conductive pattern CP1-2 and the second conductive pattern CP1-2. The first conductive pattern CP1-2 and the insulation layer IL-2 are substantially the same as the first conductive pattern CP1 and the insulation layer IL in FIG. 4A. Hereinafter, redundant description will be omitted.

The second conductive pattern CP2-2 may have a shape different from a shape on a cross-section of the first conductive pattern CP1-2 or a shape of a top surface of the insulation layer IL-2. For example, the second conductive pattern CP2-2 may have a top surface CP2-US2 including a plurality of waved portions RP2 and a plurality of flat portions FP2, and the waved portions RP2 may include a waved surface. The top surface CP2-US2 of the second conductive pattern may have a waved shape that is varied according to the shape of the first conductive pattern CP1-2. However, as a thickness of the insulation layer IL-2 and a thickness of the second conductive pattern CP2-2 increase, an effect that is caused by the shape of the first conductive pattern CP1-2 to the top surface CP2-US2 of the second conductive pattern may decrease. Accordingly, although the first conductive pattern CP1-2 may have a tapered shape on a cross-section, the waved portions RP2 may have a waved shape that is waved on a cross-section perpendicular to the second direction D2.

In the display panel according to an embodiment of the inventive concept, the second conductive pattern CP2-1 and CP2-2 may have variously shaped waved top surface. According to an embodiment of the inventive concept, as the cross-sectional shape of the first conductive pattern CP1-1 and CP1-2, the planar shape of the first conductive pattern CP1-1 and CP1-2, the thickness of the first conductive pattern CP1-1 and CP1-2, the thickness of the insulation layer IL, and the thickness of the second conductive pattern CP2-1 and CP2-2 are controlled, the waved degree of the top surface CP2-US1 and CP2-US2 of the second conductive pattern may also be controlled in various manners.

Figure 9A:
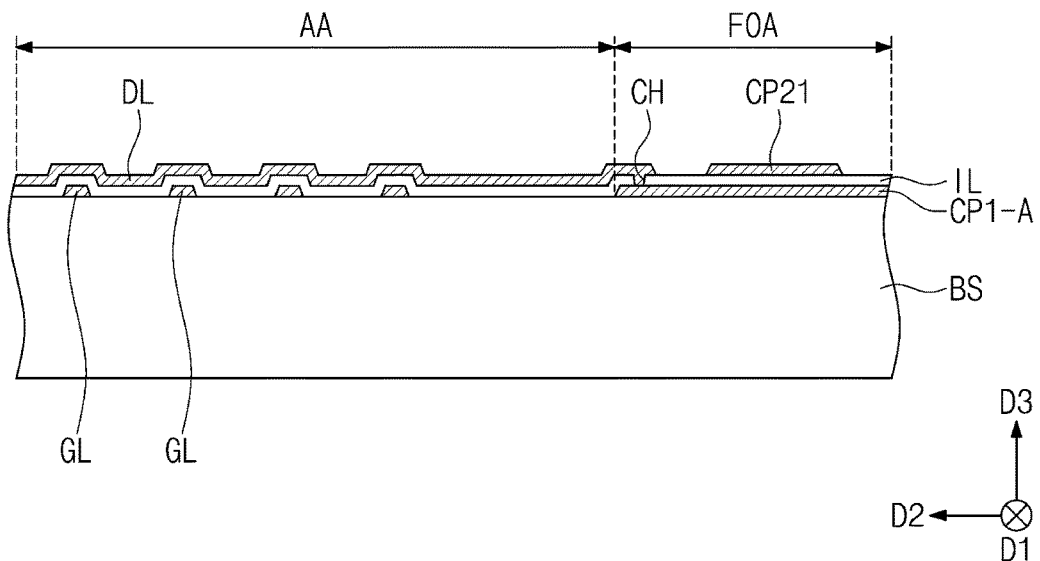
FIGS. 9A and 9B are cross-sectional views illustrating a portion of a display panel according to an embodiment of the inventive concept.
Figure 9B:
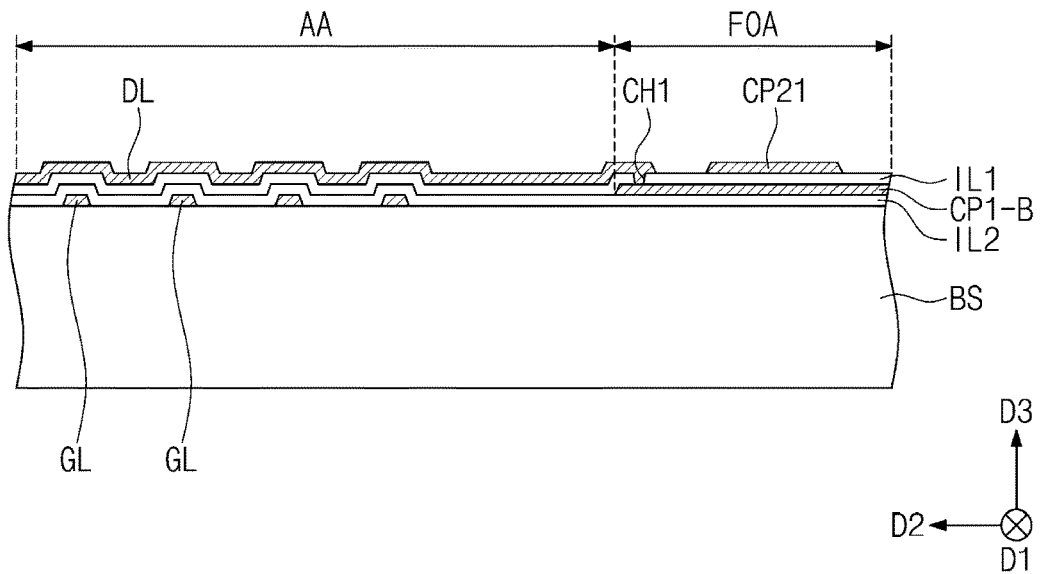

FIGS. 9A and 9B are cross-sectional views illustrating a portion of a display panel, according to an embodiment of the inventive concept. For ease of description, in FIGS. 9A and 9B, cross-sections of a portion of the active area AA and a portion of the fan-out area FOA in FIG. 2 are illustrated.

As illustrated in FIG. 9A, on the active area AA, gate lines GL each extending in the first direction D1 cross one data line DL extending in the second direction D2 in an insulation manner. The data line DL may extend from the active area AA and be connected to the first conductive pattern CP1-A on the fan-out area FOA. A first conductive pattern CP1-A may be on the same layer as the gate lines GL and may be on a different layer from the data line DL. Accordingly, the data line DL passes through the insulation layer IL through a contact hole CH, and is connected to the first conductive pattern CP1-A.

A first pattern CP21 of the second conductive pattern CP2 (See, for example, FIG. 3) may be on a different layer from the first conductive pattern CP1-A, and may cross the first conductive pattern CP1-A in an insulation manner on a plane. The first pattern CP21 is connected to the power line PL (See, for example, FIG. 0.3) and is spaced apart from the data line DL.

As illustrated in FIG. 9B, a plurality of insulation layers may be located between the gate lines GL and the data line DL. In some example embodiments, a first insulation layer IL1 and a second insulation layer IL2 may be located between the gate lines GL and the data line DL.

A first conductive pattern CP1-B may be on a different layer from the gate lines GL and the data line DL. The first conductive pattern CP1-B may be located between the first insulation layer IL1 and the second insulation layer IL2 and spaced apart from the gate lines GL and the data line DL on a cross-section. The data line DL is connected to the first conductive pattern CP1-B through a contact hole CH1 passing through the first insulation layer IL1. The embodiment of the inventive concept is not limited to the position of the first conductive pattern CP1-A and CP1-B. For example, the first conductive pattern CP1-A and CP1-B according to an embodiment of the inventive concept may be on various layers when the first conductive pattern CP1-A and CP1-B overlaps the second conductive pattern CP2 on a plane.

Figure 10A:
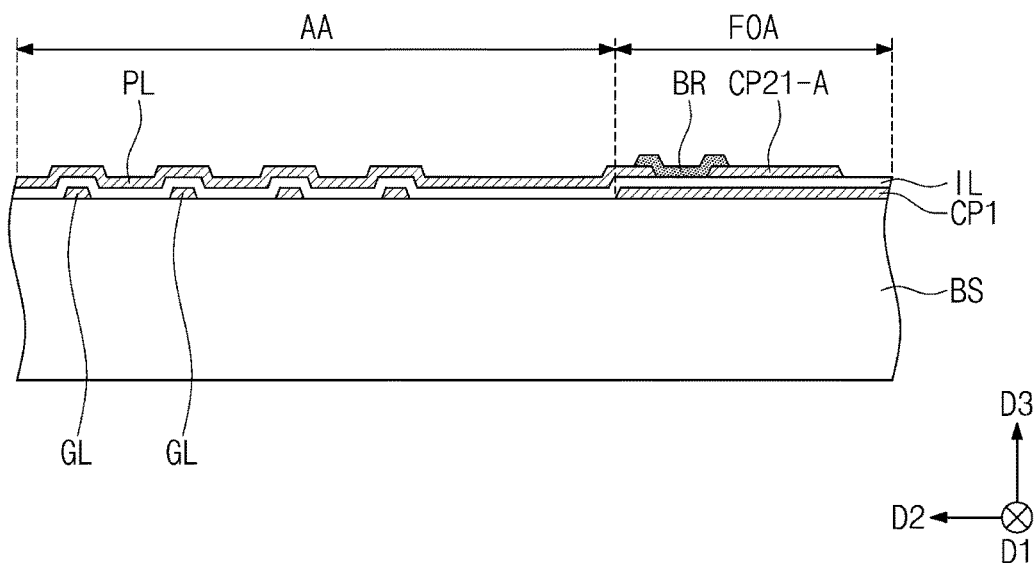
FIGS. 10A and 10B are cross-sectional views illustrating a portion of a display panel according to an embodiment of the inventive concept.
Figure 10B:
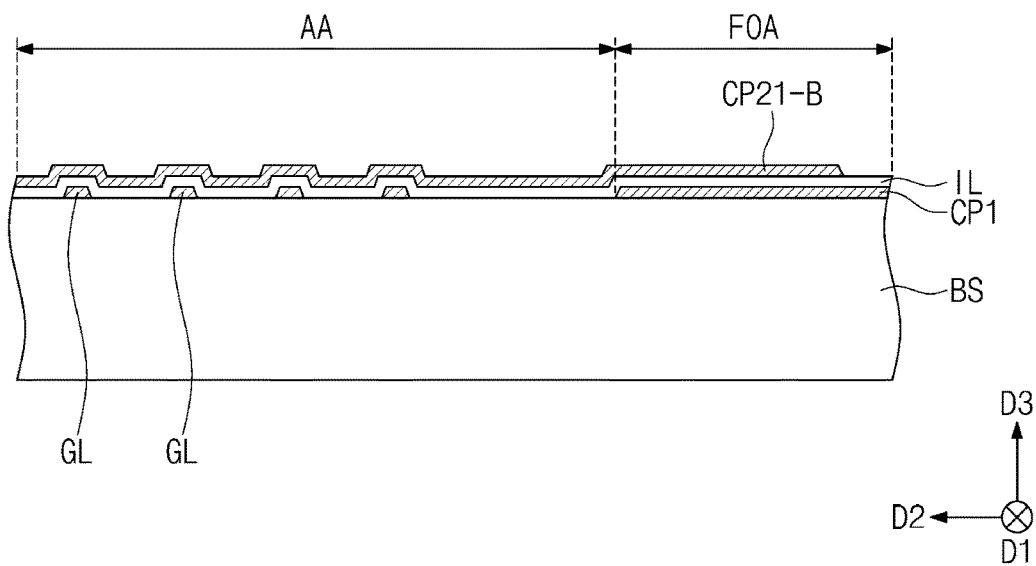

FIGS. 10A and 10B are cross-sectional views illustrating a portion of a display panel according to an embodiment of the inventive concept. For ease of description, in FIGS. 10A and 10B, cross-sections of a portion of the active area AA and a portion of the fan-out area FOA in FIG. 2 are illustrated, and some components are omitted.

As illustrated in FIG. 10A, one power line PL may cross a plurality of gate lines GL in an insulation manner on the active area AA. The power line PL may extend from the active area AA and be connected to a first conductive pattern CP21-A on the fan-out area FOA. The first conductive pattern CP21-A may be on the same layer as the power line PL.

Here, the display panel may further include a bridge pattern BR connecting the power line to the first pattern CP21-A. The bridge pattern BR is on the insulation layer IL to electrically connect the power line PL to the first pattern CP21-A.

In some example embodiments, as illustrated in FIG. 10B, a first pattern CP21-B may extend from the fan-out area FOA to the active area AA. As such, the power line PL may be integrated with the first pattern CP21-B. Accordingly, in a single conductive pattern on the insulation layer IL, a portion on the active area AA may be the power line, and a portion on the fan-out area FOA may be the first pattern CP21-B. The embodiment of the inventive concept is not limited to the position of the first conductive pattern CP21-A and CP21-B. For example, the first pattern CP21-A and CP21-B according to an embodiment of the inventive concept may be on various positions, as the first pattern CP21-A and CP21-B overlaps the first conductive pattern CP1 on the plane.

According to the embodiment of the inventive concept, as the waved degree of the waved top surface of the conductive pattern is controlled, the problem of the conductive pattern being seen due to the external light reflection may be resolved.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Although exemplary embodiments of a supply modulator for power amplifier have been specifically described and illustrated herein, many modifications and variations will be apparent to those skilled in the art. Accordingly, it is to be understood that a display device with reduced external light reflectance constructed according to principles of this invention may be embodied other than as specifically described herein. The invention is also defined in the following claims, and equivalents thereof.

What is claimed is:
1. A display device comprising:
   a base substrate comprising a front surface having an active area and a peripheral area, and a rear surface opposite to the front surface;
   a plurality of pixels on the active area;
   a plurality of first signal lines on the active area, the first signal lines extending in a first direction, spaced apart from each other in a second direction crossing the first direction, and connected to the pixels;
   a plurality of second signal lines on the active area, crossing the first signal line in an insulation manner, and connected to the pixels;
   a plurality of first conductive patterns on the peripheral area, spaced apart from each other in the first direction, and connected to the second signal lines;
   a second conductive pattern overlapping the first conductive patterns on a plane in the peripheral area and having a top surface waved in the first direction; and
   an optical member on the second conductive pattern and overlapping the active area and the peripheral area,
   wherein the top surface of the second conductive pattern comprises flat portions and protruding portions that are alternately arranged in the first direction, and the protruding portions protrude from the flat portions toward the optical member, and
   a gap between the protruding portions in the first direction is about 1.5 µm.
2. The display device of claim 1, wherein the flat portions are parallel to the front surface of the base substrate.
3. The display device of claim 1, wherein each of the protruding portions comprises:
   a connecting portion comprising a first inclined surface inclined from the front surface of the base substrate and a second inclined surface inclined from the front surface of the base substrate; and
   an inclined angle formed between the base substrate and each of the first inclined surface and the second inclined surface is equal to or less than about 36° or equal to or greater than about 49°.
4. The display device of claim 1, wherein a gap between two consecutive ones of the protruding portions in the first direction is equal to or greater than about 6 µm.
5. The display device of claim 1, wherein the second signal lines are connected to the pixels to transmit data signals to the pixels.
6. The display device of claim 1, further comprising a plurality of third signal lines connected to the pixels, parallel to the second signal lines, and crossing the first signal lines in an insulation manner,
   wherein the third signal lines are connected to the second conductive pattern.
7. The display device of claim 1, wherein the optical member comprises at least one of a polarizing film and a retardation film.
8. The display device of claim 3, wherein each of the first inclined surface and the second inclined surface has a linear shape on a cross-section perpendicular to the second direction.
9. The display device of claim 3, wherein each of the first inclined surface and the second inclined surface has a linear shape on a cross-section perpendicular to the second direction, and
   wherein the inclined angle is an angle at a point at which the first inclined surface or the second inclined surface contact the connecting portion.
10. The display device of claim 5, wherein each of the first conductive patterns is on a different layer from the second signal lines.
11. The display device of claim 6, wherein the second conductive pattern is on the same layer as the second signal lines.
12. The display device of claim 6, wherein the second conductive pattern has a shape integrated with the third signal lines.
13. The display device of claim 6, wherein:
   each of the pixels comprises a thin-film transistor and a light emitting element connected to the thin-film transistor,
   the second conductive pattern comprises a first pattern and a second pattern that are spaced apart from each other on the plane,
   the third signal lines configured to receive an electrical signal from the first pattern, and
   the light emitting element configured to receive an electrical signal from the second pattern.
14. A display device comprising:
   a base substrate comprising a front surface having an active area and a peripheral area, and a rear surface opposite to the front surface;
   a plurality of pixels on the active area, each of the pixels comprising an organic light emitting element;
   gate lines on the active area and connected to the pixels to provide gate signals;
   data lines crossing the gate lines in an insulation manner and connected to the pixels to provide data signals;
   power lines on the active area and connected to the pixels to provide first power signals;
   a first conductive pattern on the peripheral area and electrically connected to the data lines;
   a second conductive pattern on the peripheral area and connected to first power lines and crossing the first conductive pattern in an insulation manner; and
   an optical member on the base substrate to cover the pixels and the second conductive pattern,
   wherein a top surface of the second conductive pattern has an inclined surface that is inclined with respect to the front surface, and an inclined angle of the inclined surface is equal to or less than about 36° or equal to or greater than about 49°.

15. The display device of claim 14, wherein the top surface of the second conductive pattern comprises a plurality of protruding portions comprising the inclined surface and flat portions between two consecutive ones of the protruding portions to connect the protruding portions to each other.

16. The display device of claim 14, wherein the first conductive pattern is on the same layer as the gate lines, and
the second conductive pattern is on the same layer as the data lines.

17. The display device of claim 14, wherein the first conductive pattern is on a different layer from the gate lines and the data lines.

18. The display device of claim 14, wherein an inclined angle of the inclined surface is equal to or greater than about 60°.

19. The display device of claim 15, wherein a gap between the two consecutive ones of the protruding portions is equal to or greater than about 1.5 μm.

20. The display device of claim 15, wherein:
the first conductive pattern comprises a plurality of patterns spaced apart from each other in one direction,
the protruding portions are at positions corresponding to the patterns, and
the flat portions are at positions corresponding to spaces between the patterns.

* * * * *